United States Patent
Cobb

(10) Patent No.: US 10,326,027 B2
(45) Date of Patent: Jun. 18, 2019

(54) TFT DEVICE AND MANUFACTURING METHOD

(71) Applicant: Nederlandse Organisatie voor toegepast-natuurwetenschappelijk onderzoek TNO, 's-Gravenhage (NL)

(72) Inventor: Brian Hardy Cobb, 's-Gravenhage (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 15/755,757

(22) PCT Filed: Aug. 26, 2016

(86) PCT No.: PCT/NL2016/050596
§ 371 (c)(1),
(2) Date: Feb. 27, 2018

(87) PCT Pub. No.: WO2017/039436
PCT Pub. Date: Mar. 9, 2017

(65) Prior Publication Data
US 2019/0027613 A1    Jan. 24, 2019

(30) Foreign Application Priority Data

Aug. 28, 2015   (EP) ..................... 15182911

(51) Int. Cl.
*H01L 29/66*    (2006.01)
*H01L 21/308*   (2006.01)
(Continued)

(52) U.S. Cl.
CPC ...... *H01L 29/78696* (2013.01); *H01L 21/308* (2013.01); *H01L 29/42384* (2013.01);
(Continued)

(58) Field of Classification Search
CPC ..... H01L 51/56; H01L 33/62; H01L 51/5056; H01L 51/5072; H01L 51/5221
(Continued)

(56) References Cited

U.S. PATENT DOCUMENTS 6,111,296 A    8/2000 Yamazaki et al.
6,653,687 B1   11/2003 Yamazaki
(Continued)

FOREIGN PATENT DOCUMENTS

JP    S60195976 A    10/1985
JP    S6394686 A     4/1988
(Continued)

OTHER PUBLICATIONS

Jun. 28, 2010—Lausecker et al., "Self-aligned imprint lithography for top-gate amorphous silicon thin-film transistor fabrication", Appl. Phys. Lett. 26 (2010).
(Continued)

*Primary Examiner* — Andy Huynh
(74) *Attorney, Agent, or Firm* — Banner & Witcoff, Ltd.

(57) ABSTRACT

A TFT device is manufactured starting from a substrate with mutually insulated elongated strips of semi-conductor material. A stack of layers over the strips on the substrate, the stack comprising a gate electrode layer. A multi-level resist layer is provided over the gate electrode layer. The multi-level resist layer defines gate and source drain regions, the channel running in parallel with the direction of the strips. Gate portions in the resist layer cross source drain regions in the resist layer, overreaching the source drain regions on either side at least by a distance corresponding to a pitch of the strips.

7 Claims, 5 Drawing Sheets

(51) Int. Cl.
*H01L 29/423* (2006.01)
*H01L 29/786* (2006.01)

(52) U.S. Cl.
CPC .. *H01L 29/66742* (2013.01); *H01L 29/66757* (2013.01); *H01L 29/7869* (2013.01)

(58) Field of Classification Search
USPC ........................................................ 257/401
See application file for complete search history.

(56) References Cited

U.S. PATENT DOCUMENTS

| | | | |
|---|---|---|---|
| 6,841,475 | B1 | 1/2005 | Chen |
| 7,341,893 | B2 | 3/2008 | Mei et al. |
| 8,617,961 | B1 | 12/2013 | Haran et al. |
| 2001/0005022 | A1 | 6/2001 | Ogura |
| 2003/0138704 | A1 | 7/2003 | Mei et al. |
| 2003/0218170 | A1 | 11/2003 | Yamazaki et al. |
| 2004/0262698 | A1 | 12/2004 | Nowak |
| 2005/0176182 | A1 | 8/2005 | Me et al. |
| 2006/0091481 | A1 | 5/2006 | Li et al. |
| 2007/0126037 | A1 | 6/2007 | Ikeda |
| 2007/0284346 | A1* | 12/2007 | Choo ................ G02F 1/133528 219/121.69 |
| 2008/0131603 | A1* | 6/2008 | Aruga ................ G02F 1/133514 427/256 |
| 2009/0250700 | A1 | 10/2009 | Afentakis et al. |
| 2009/0253238 | A1 | 10/2009 | Shi et al. |
| 2011/0281412 | A1 | 11/2011 | Ernst et al. |
| 2012/0223288 | A1 | 9/2012 | Kim et al. |
| 2012/0326157 | A1 | 12/2012 | Park et al. |
| 2013/0134513 | A1 | 5/2013 | Standaert et al. |
| 2014/0264593 | A1 | 9/2014 | Lin et al. |
| 2014/0326955 | A1 | 11/2014 | Barraud et al. |

FOREIGN PATENT DOCUMENTS

| | | |
|---|---|---|
| JP | 2009277733 A | 11/2009 |
| WO | 14178835 A1 | 11/2014 |
| WO | 2015010825 A1 | 1/2015 |

OTHER PUBLICATIONS

Jun. 2009—Jackson et al., "Fabrication of Zinc Tin Oxide TFTs by Self-Aligned Imprint Lithography (SAIL) on Flexible Substrates", SID 09 Digest, pp. 873-876 (2009).

Nov. 2009—Kim et al., "Roll-to-roll manufacturing of electronics on flexible substrates using self-aligned imprint lithography (SAIL)", SID, pp. 963-970, 17/11, 2009.

Mar. 28, 2014 Sabik et al., "High resolution patterning for flexible electronics via roll-to-roll nanoimprint lithography", Proc. SPIE 9049, Alternative Lithographic Technologies VI (2014).

Jan. 18, 2012—Qin et al., "Organic Thin-Film Transistors with Anodized Gate Dielectric Patterned by Self-Aligned Embossing on Flexible Substrates", Advanced Functional Materials 22, (2012).

Nov. 3, 2016—International Search Report and Written Opinion of PCT/NL2016/050596.

* cited by examiner

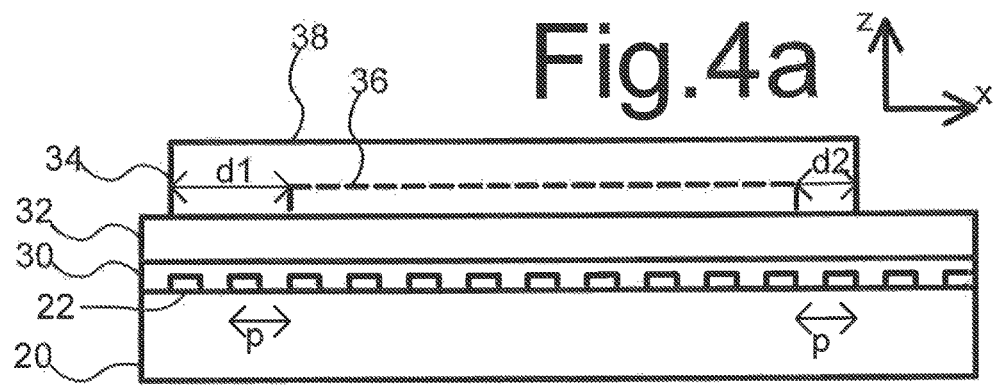
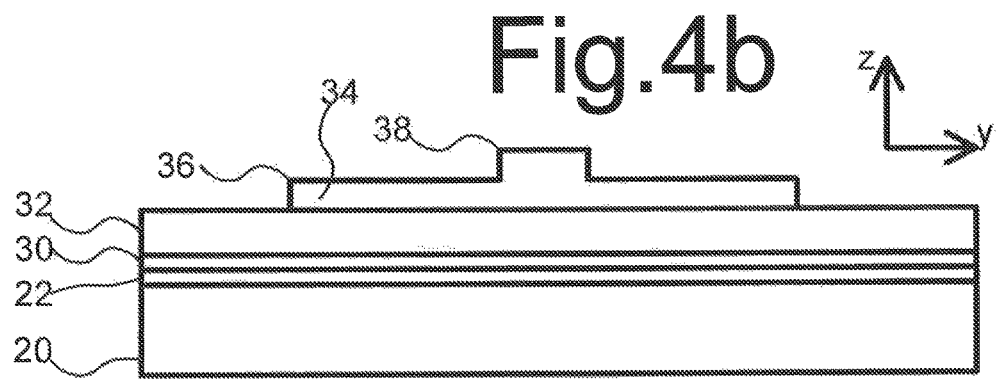
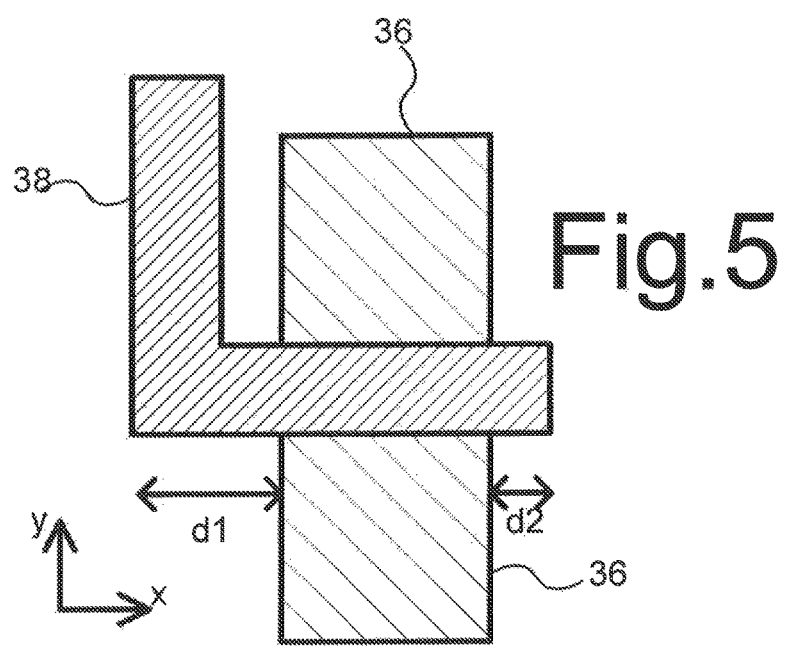

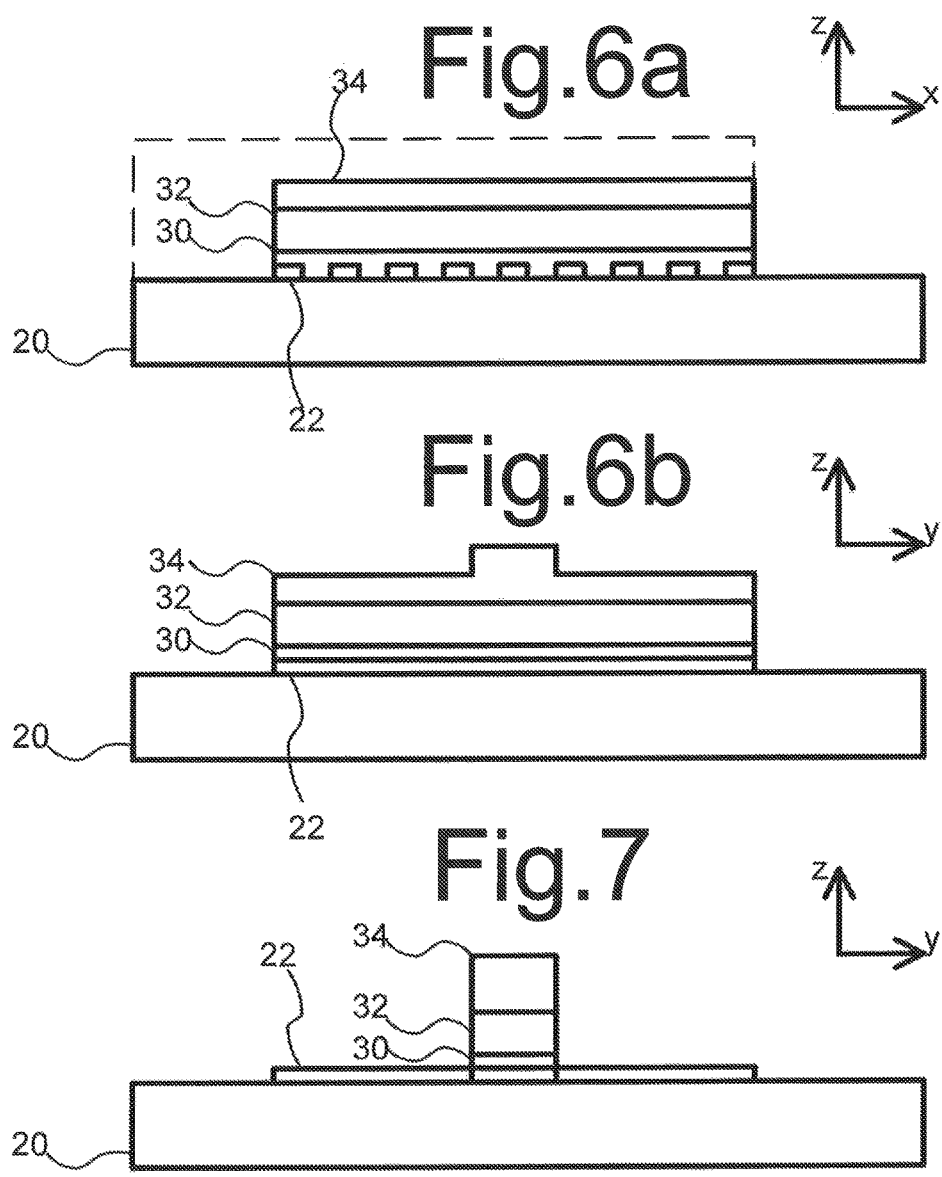

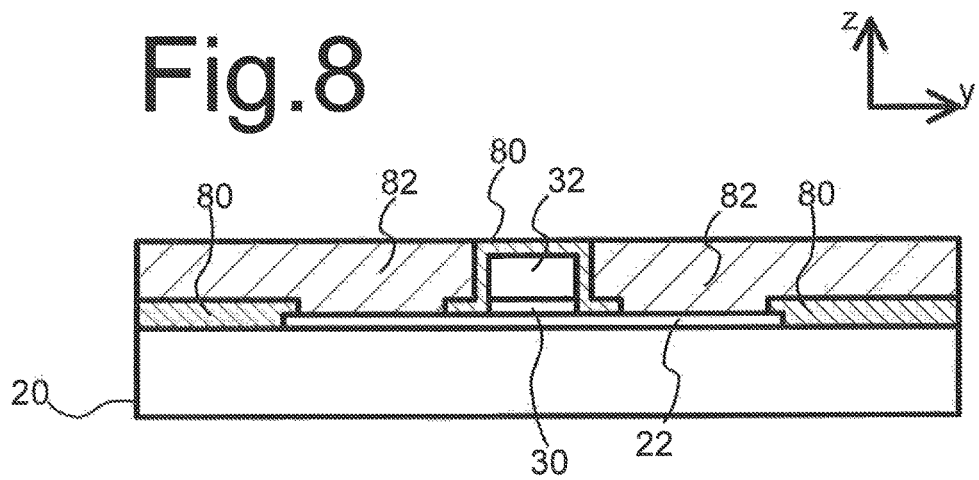

TFT DEVICE AND MANUFACTURING METHOD

CROSS-REFERENCE TO RELATED APPLICATIONS

This application is a U.S. National Stage application under 35 U.S.C. § 371 of International Application PCT/NL2016/050596 (published as WO 2017/039436 A1), filed Aug. 26, 2016 which claims the benefit of priority to Application EP 15182911.6, filed Aug. 28, 2015. Benefit of the filing date of each of these prior applications is hereby claimed. Each of these prior applications is hereby incorporated by reference in its entirety.

FIELD OF THE INVENTION

The invention relates to a method of manufacturing a device that comprises a thin film transistor (TFT) and to a method of manufacturing a display device.

BACKGROUND

TFTs are used in devices such as LCD display panels. A TFT comprises a channel in the form of a thin film of semi-conductor material in a channel area on a substrate and a conductive gate, separated from the semi-conductor material by an insulating layer. A top gate or a bottom gate may be used, wherein the semi-conductor material is between the gate and the substrate or the gate is between the semi-conductor material and the substrate respectively. The gate crosses the channel area, defining source and drain areas in the channel area on either side of the gate.

U.S. Pat. No. 7,341,893 describes a method of manufacturing a device with such transistors by means of imprinting, called the SAIL process (self-aligned imprint lithography). In the SAIL process, a single resist layer of variable height is used to define different areas on the substrate that will be processed using different process steps. The resist is made to have different height levels above the different areas by means of stamping, or a gray level photo exposure pattern.

The principle is that the resist is etched in successive steps, each for a duration that removes the resist from its lowest (remaining) height level to the bottom of the resist, without fully removing the resist where it has a higher height level. Subsequently, a process step can be applied to the exposed areas through the mask formed by the remaining resist. This can be repeated for successively higher levels. The SAIL process has the advantage that the relative position of all the areas is defined by the 3D pattern of a single resist layer. No alignment of different patterning steps of different resist layers is needed.

Underneath the resist a stack of a plurality of thin film layers for use to form transistors is provided. This may include a layer of semi-conductor material, a (gate) isolation layer, a metal layer etc. The different process steps after removal of the resist from respective height levels may provide for removal of part or all of the layers in the stack through the mask formed by the resist after etching from the respective height level and/or deposition of additional material through that mask.

U.S. Pat. No. 7,341,893 describes an application of a SAIL process to the manufacture of a bottom gate TFT. In this process, a stack of thin film layers is provided on top of a substrate with parallel conductive strips. The gate electrodes are formed by sections of a plurality of such parallel strips. The channel runs from the source to the drain separation transverse to the long direction of the strips. The stack of thin film layers contains a gate insulation layer, a semi-conductor layer and a top metal layer. In the SAIL process different height levels are use to etch the strips where needed to isolate sections that form the gate electrode, to deposit gate contacts, isolate different channels and to remove top metal in order to separate source and drain contacts. Because the semi-conductor layer overlies the gate electrode it is easy to etch the channel in the semi-conductor layer so that the gate electrode extends beyond it, preventing source-drain leakage around the gate.

When applied to a top gate TFT, it is more difficult to avoid this type of leakage in a SAIL process. In a multi-mask process (not SAIL), the semi-conductor layer can be patterned using a first mask before the gate electrode layer is deposited and defined using a second mask, the masks ensuring that that the gate electrode extends beyond it. The problem with the SAIL process is that the gate electrode lies over the semi-conductor layer, so that the semi-conductor layer must be etched while the gate electrode lies on top of it. It is known to use an undercutting etch process to remove the semi-conductor layer also under the edge of the gate electrode, where it could otherwise give rise to source-drain leakage around the gate. Another solution is to extend the gate electrode well beyond the source-drain areas, thereby forcing any leakage current to make a large detour that increases resistance in the leakage path.

SUMMARY

Among others, it is an object to provide for an easier process of manufacturing a device comprising a thin film transistor that reduces leakage.

A method of manufacturing a semi-conductor device comprising a thin film transistor is provided, the method comprising providing a substrate with mutually insulated elongated strips of semi-conductor material on the substrate, the strips extending in a first direction;

depositing a stack of layers over the strips on the substrate, the stack comprising a gate electrode layer and a gate insulation layer between the gate electrode layer and the strips;

providing a multi-level resist layer comprising first and second parts with a first and second non-zero resist height level on top of the stack respectively, the first resist height level being smaller than the second resist height level, the second part comprising a portion that crosses the first part in a second direction transverse to the first direction, overreaching the first part on either side at least by a distance corresponding to a pitch of the strip;

etching the stack and the strips over an area of the substrate not covered by the first and second parts, using the multi-level resist layer as a mask;

etching the multi-level resist layer at least down from the first resist height level, leaving the substrate underneath the second part covered by resist from the multi-level resist layer;

etching the stack to expose parts of the strips where the first part of the multi-level resist layer has been removed, leaving a part of the gate electrode layer underneath the second part of the multi-level resist layer for use as a gate electrode of the transistor;

forming source and drain contacts of the transistor from the exposed parts of the strips.

Herein a device is created on a substrate on which mutually insulated parallel elongated strips of semi-conductor material are provided that extend in a first direction. The channel of a thin film transistor will be formed from a plurality of such strips in parallel. On the substrate with the strips a stack is deposited that comprises layers of gate electrode material and gate insulation material. On top, a multi-level resist is provided, which contains areas with at least a first and second non-zero resist height level. Outside these areas the stack and the strips are etched off the substrate. An area where the second (larger) resist height level is present comprises a gate area that extends in a second direction, perpendicular to the strips or more generally transverse to the strips, over a plurality of the strips. First areas where the first (smaller) resist height level is present serve to define source and drain regions of the strips on either side of the gate area. The gate area overreaches the first areas in the second direction by a distance that is at least equal to the pitch of the strips.

The multi-level resist is etched first to remove the resist from to the first resist level, leaving resist in the gate area. The strips are subsequently exposed by selectively etching the stack. In the area where the strips are exposed source and drain contacts are created.

Under each overreach, a part of further strip may remain with edges due to etching that are aligned with the gate area. Because such strips do not extend to the source and drain contacts they do not form part of the channel. The first strip that forms part of the channel is separated from the lateral edge of the gate at least by the distance between successive strips. This prevents formation of a leakage channel. In this two patterning steps are accomplished at once without risking a leakage channel, eliminating the need for alignment of the two patterning steps.

BRIEF DESCRIPTION OF THE DRAWING

These and other objects and advantageous aspects will be apparent from a description of exemplary embodiments with reference to the following figures.

FIG. 4a,b show side views of a substrate with a stack and a multilevel resist

FIG. 5 shows a top view of the multilevel resist

FIG. 6a,b shows side views of a substrate with a stack after a first etch stage

FIG. 7 shows a side view of a substrate with a stack after a second etch stage

FIG. 8 shows a side view after further processing

DETAILED DESCRIPTION OF EXEMPLARY EMBODIMENTS

Figure 1:
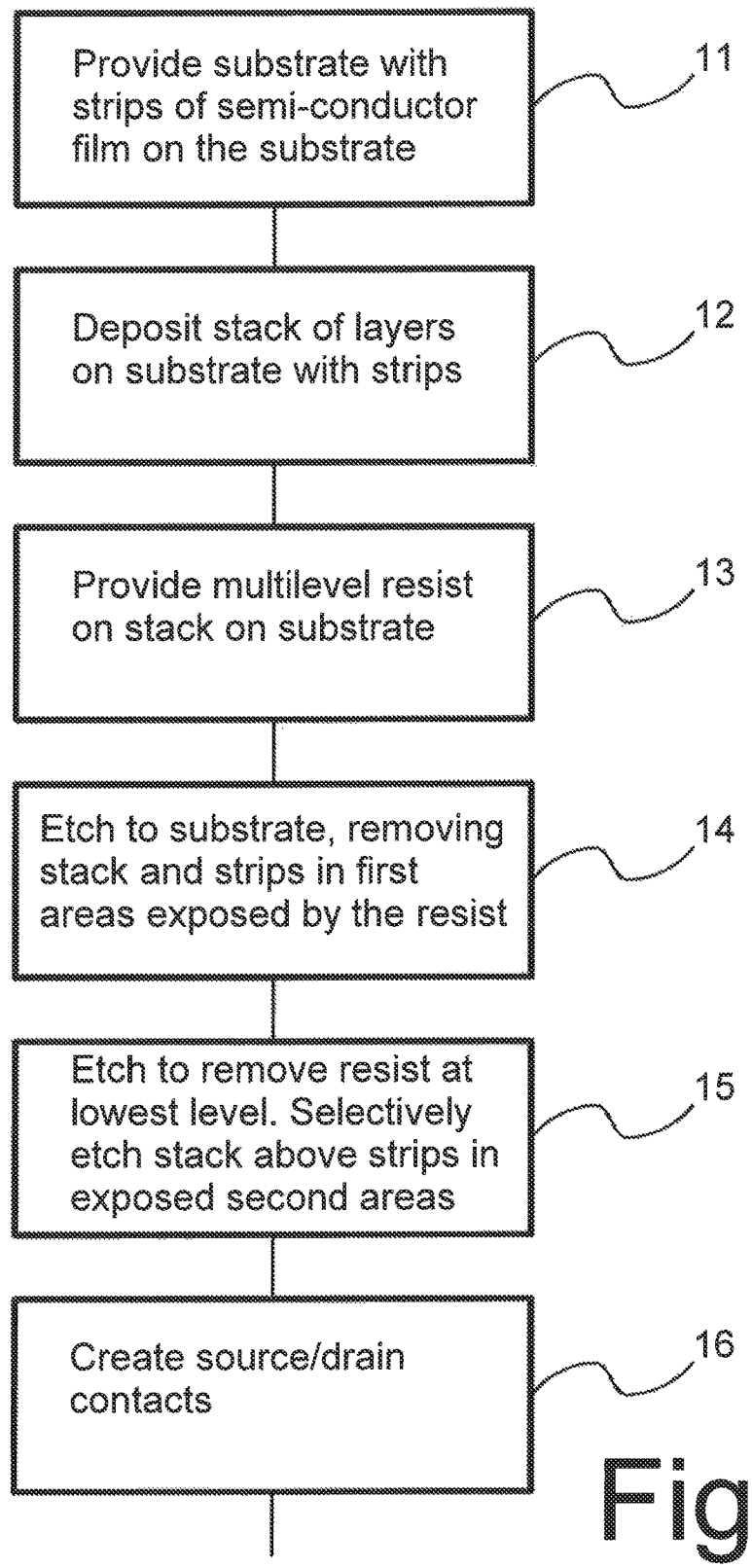
FIG. 1 shows a flow chart of a TFT device manufacturing process
Figure 2:
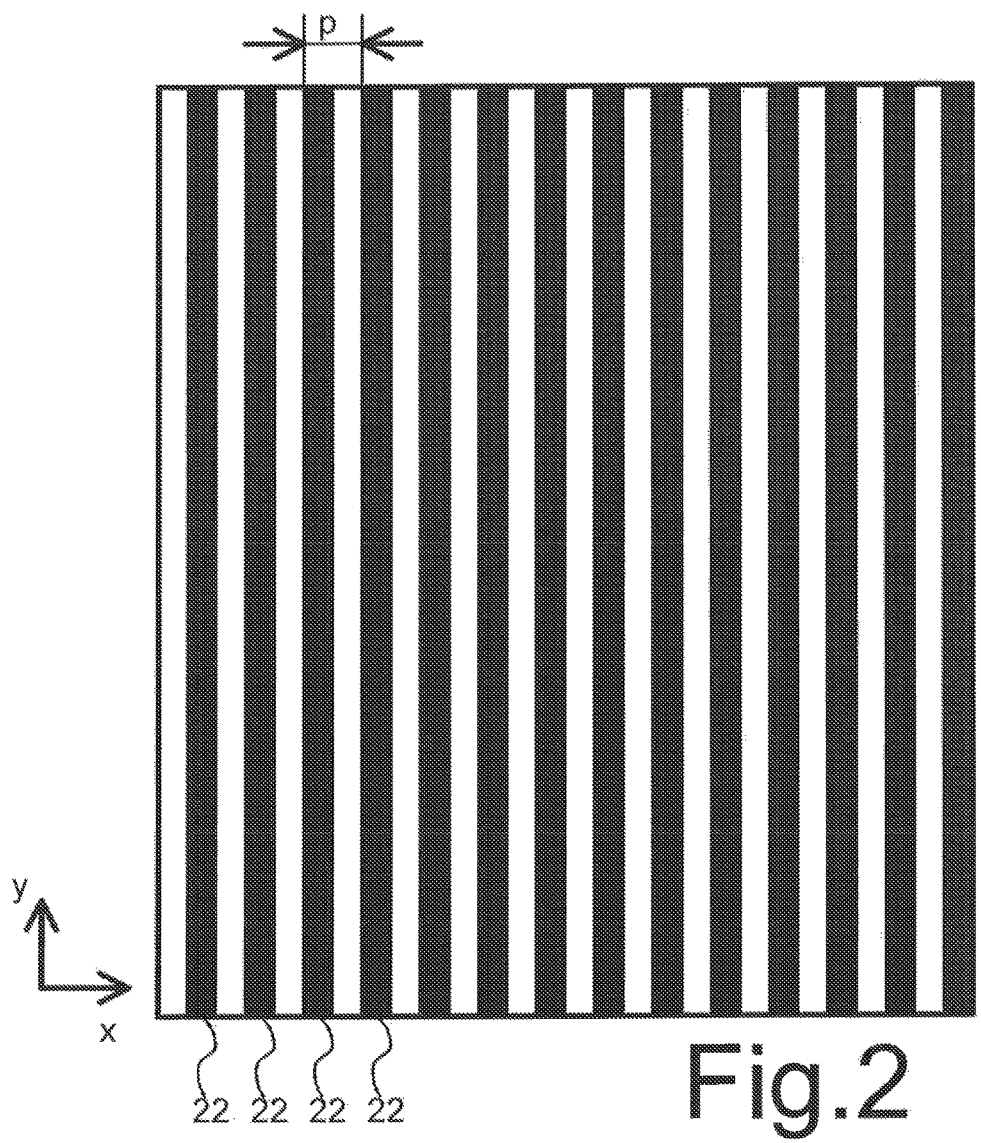
FIG. 2 shows a top view of a substrate with strips of semi-conductor film
Figure 3:
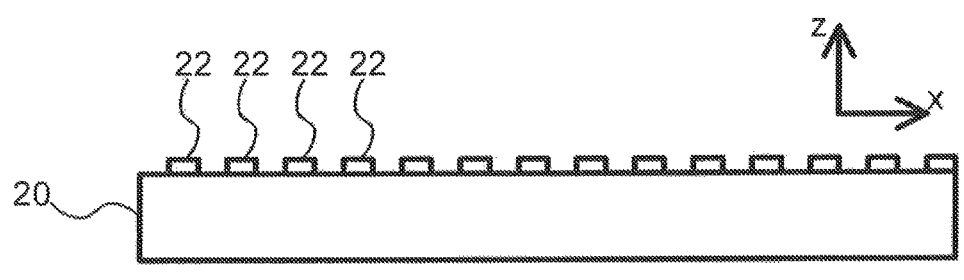
FIG. 3 shows a side view of a substrate with strips of semi-conductor film

FIG. 1 shows a flow chart of a TFT device manufacturing process. In a first step 11 of this process a substrate with parallel strips of semiconductor film on the substrate is provided. FIG. 2 shows a top view of part of such a substrate with strips 22. FIG. 3 shows a side view of such a substrate 20 with strips 22 of semiconductor on top of substrate. The surface of substrate 20 that is in contact with strips 22 is of a material that electrically isolates strips from one another. For reference x, y coordinate axes will be used to designate perpendicular horizontal directions parallel to the surface of substrate 20 and a z coordinate axis will be used to designate the vertical axis perpendicular to the surface. Strips 22 are elongated strips with their long direction extending in the y-direction.

In the illustrated embodiment all strips 22 have the same width and pitch in the x-direction (the pitch "p" is the sum of the width of the strip and the distance to the next strip. In exemplary embodiments, the width of a strip may lie in a range of 0.1 to 2 micrometer, with a spacing between strips in a range of 0.05 and 2 micrometer and a pitch in a range of 0.15 to 4 micrometer, equal to the sum of the width and the spacing. All strips 22 preferably have the same width and the same pitch "p" everywhere on substrate 20 and the set of strips 22 may extend over the entire substrate surface. However, this is not necessary: not all of the substrate surface may need to be covered with strips and the pitch p, the width and the distance may vary over the surface. Although FIGS. 2 and 3 suggest that the width of strips 22 and the distance between successive strips 22 are equal to each other, this is not necessary. Preferably, the width is larger than the distance (e.g. between 50% and 90% of the pitch), as long as the strips are electrically separate. In other embodiments the width may be smaller than the distance (e.g. between 10% and 50% of the pitch). Although substrate 20 is shown as a single structure, it should be understood that substrate 20 may comprise a plurality of layers.

The substrate with strips 22 may be prefabricated. Any suitable method of providing such a substrate 20 with strips 22 may be used. For example, an indium-gallium oxide semi-conductor film may be sputtered onto the substrate surface and subsequently patterned into strips 22 by means of photolithography. But other deposition techniques such as CVD, spin coating, printing etc. may be used. Other patterning techniques may be used such as imprinting, IJP, intermittent slot die coating etc. Other semi-conductor materials may be used.

In a second step 12 of the process of FIG. 1, a stack of layers is deposited on the substrate and the strips. By way of example a stack comprising a gate insulator layer and a gate electrode layer over the gate oxide layer may be deposited. Any suitable deposition process and material may be used. For example a silicon dioxide gate insulator may be deposited by means of PECVD and a molybdenum layer may be sputtered on top as a gate electrode layer. The stack preferably continuously covers the entire substrate, although this is not necessary. The stack need not be patterned at this stage.

In a third step 13 of the process of FIG. 1, a multilevel resist is provided on the stack. Methods of doing so are known per se from SAIL processes. Different levels may be created for example by imprinting a resist layer with a multilevel stamp, or by means of grey level photolithography.

FIG. 4a, b show cross-sections in xz and yz planes of substrate 20 with a stack consisting of a layer of gate insulation material 30, a layer of gate electrode material 32 and a multi-level resist layer 34 on top of the stack. The layers are not to scale. FIG. 5 shows a top view, showing the multi-level resist layer in the xy plane, similarly not to scale.

Multi-level resist layer 34 has a first part 36 that has a first non-zero height level and a second part 38 that has a second height level greater than the first height level. First part 36 defines the location of the source and drain contacts of a thin film transistor in the final device. Second part 38 defines the location of the gate electrode of the thin film transistor and its connecting wiring in the final device. A rectangular portion of second part 38 crosses first part 36 in the x-direction, overreaching the first part 36 by distances d1, d2 that are at least as large as the pitch p of strips 22. In the y-direction first part 36 extends beyond second part 38 on either side of said portion of second part 38.

The xz cross-section of FIG. 4a is through second part 38, first part 36 lying in front of second part 38 in the y-direction. For reference, the position of first part 36 is shown by dashing. As can be seen, first part 36 extends over a plurality of strips 22 in the x-direction (i.e. in the direction perpendicular to the long direction of the strips (y-direction)). In the final device, these strips 22 will form the channel and source/drain contacts of a thin film transistor. For the sake of illustration, first part 36 extends over nine strips in the x-direction in FIG. 4a, but in practice a different number of strips 22, may be used, including at least a plurality of strips e.g. a larger number than nine, or eight or at least four.

As noted, second part 38 defines the location of the gate electrode. The gate electrode may be rectangular with a length, in the direction from source to drain, in a range of 0.1 to 20 micrometer and a width, perpendicular to that direction, in a range of 1 to 100 micrometer for example. Second part 38 of multi-level resist layer 34 comprises a rectangular portion that extends beyond first part 36 on both sides of first part 36 in the x-direction. As shown in FIGS. 4a and 5, the overreach is d1 on the left and d2 on the right. The overreach d1, d2 is at least equal to the pitch p of strips 22 (when the pitch p varies with location, at least p at the location between the edges of first and second part 36, 38). As will be explained, this serves to prevent source-drain leakage in the thin film transistor in the final device. Although a preferred embodiment is shown wherein second part 38 has a rectangular gate portion that extends perpendicularly to the y-direction, i.e. the long direction of the strips, it should be appreciated that more generally the gate portion may be transverse to the y-direction, i.e. perpendicular or at another crossing angle to the y-direction. The overreach in the x-direction (perpendicular to the y-direction) should be at least the pitch p. Also the gate portion need not necessarily be rectangular.

By way of example, FIG. 5 also shows the possibility that the second part comprises two mutually orthogonal track parts: a first branch crossing the channel to form the actual gate and a second branch in parallel with the channel. The preceding discussion relates to the first branch. Related criteria apply to the second branch, if present. When the second branch is close to the semi-conductor, there is the risk that the semiconductor can extend under the second branch, creating a leakage pathway. To avoid this, the gap between the second branch of second part 38 and first part 36 is preferably at least equal to the pitch p of strips 22.

Methods of providing a multi-level resist layer 34 are known per se. A multi-level resist layer 34 with a pattern of height levels may be provided for example by depositing a resist layer and stamping this layer with a mold that defines the pattern of height levels. As another example, grey level photolithography may be used, wherein a 2d illumination pattern containing areas with different light intensities is used to define corresponding areas with different heights.

Although a height pattern with two different non-zero height levels is shown, it should be appreciated that more different height levels may be used, for example to define structures that play no role in the following description. In an embodiment, when multi-level resist layer 34 is initially patterned, multi-level resist layer 34 has a further part with a further non-zero height level lower than the first height level. In this embodiment third step 13 may comprise etching multi-level resist layer 34 during a time interval of sufficient length to remove the resist up to the further height level, but not up to the first and second height level, before reaching the cross-sections shown in FIGS. 4a,b, where there is no resist on layer of gate electrode material 32 outside first and second part 36, 38.

In a fourth step 14 of the process of FIG. 1, the stack 30, 32 and the strips 22 are etched off substrate 20 in an area on substrate 20 above which no resist is present, i.e. outside the first and second parts 36, 38. In this step, multi-level resist layer 34 protects stack 30, 32 and strips from etching in a remaining area underneath it. In an embodiment a wet etching process is used, but any suitable etch process or combination of etch processes may be used. For example, fourth step 14 may comprise sub-steps of etching stack 30, 32 and the strips 22 respectively.

FIGS. 6a, b illustrate the result of fourth step 14. As can be seen, strips 22, layer 30 of gate insulation material and the layer 32 of gate electrode material are left only over a remaining area of substrate 20 where multi-level resist layer 34 is present.

A fifth step 15 of the process of FIG. 1 comprises a sub-step wherein multi-level resist layer 34 is etched for a duration of sufficient length to remove the resist up to the first height level, but not up to the second height level, so that resist is left only at the location of the second part 38 of multi-level resist layer 34. Subsequently, a sub-step comprising a selective etch is performed, wherein the remaining stack 30, 32 is etched, but not strips 22 in an area over substrate 20 that was originally covered by first part 36 of multi-level resist layer 34. The etch may be made selective by using an etchant that etches the layer 30 of gate insulation material and the layer 32 of gate electrode material, not the semi-conductor material of strips 22. A dry, anisotropic etch process may be used for example.

FIG. 7 illustrates the result of fifth step 15. As can be seen, a part of strips 22 are exposed, without the overlying layer 30 of gate insulation material and the overlying layer 32 of gate electrode material, overlying a first area of substrate 20 where the first part 36 with originally the first height level of multi-level resist layer 34 was present. Layer 30 of gate insulation material and layer 32 of gate electrode material are left only over a second area of substrate 20 where the second part 38 with originally the second height level of multi-level resist layer 34 is present.

A sixth step 16 of the process of FIG. 1 comprises creation of source and drain contacts. This may comprise a sub-step of applying a conductivity increasing treatment to the exposed strips 22 of semi-conductor material, followed sub-steps of depositing source/drain contact metal and patterning of the source/drain contact metal. An example of a conductivity increasing treatment of an indium-gallium oxide semi-conductor is the deposition of silicon nitride on the exposed semi-conductor (i.e. strips 22). A layer of silicon nitride may be deposited by PCVD for example. Other examples of conductivity increasing treatments are H2 doping of the semiconductor (IGZO for example) from a SiNx passivation layer, or Argon sputter treatment inducing doping via surface damage, or Adding calcium to the surface to react with oxygen from the IGZO and removing it from the layer. The source/drain contact metal is deposited after re-exposing the strips e.g. by etching off the silicon nitride at least from part of strips 22 where they are not covered by stack 30, 32. The source/drain contact metal may be patterned by means of photolithography, printing etc. FIG. 8 illustrates the result of sixth step 16 after source/drain contact metal 82 has been deposited and patterned. The figure shows a cross-section in a z-y plane, i.e. in a plane that is parallel with the length of a strip 22. Therefore only one strip 22 is visible. As can be seen, a device comprising a thin film transistor has been formed, wherein parallel strips 22 (only one shown) form the transistor channel, with a gate formed by a gate electrode from a remaining part of the layer 32 of gate electrode material, isolated from the channel by a remaining part of the layer 30 of gate insulation material.

The device comprises a substrate 20 and a plurality of elongated strips 22 of semi-conductor material on the substrate 20, each of the strips 22 extending in the y direction. A gate electrode is provided above the strips in a gate area that extends in the x-direction, or more generally in a second direction transverse to the y direction, over said plurality of the strips. The device comprises a transistor channel is formed by strips 22 that have first parts that extend on respective sides of the gate area along said first direction, a conductivity of the first parts of said strips 22 having an enhanced conductivity compared to second parts of said strips 22 that lie under the gate area. The boundary between these first and second parts is aligned with the gate area. In this context, "aligned" corresponds to the result of enhancement using the gate stack as a mask for the enhancement.

The gate area overreaches the strips in said second direction on both sides of said plurality of strips 22 by a distance corresponding to at least a pitch of the strips 22. Under each overreach, a further strip may be present or an outermost strip of the channel may have a protrusion that extends into the overreach. The device comprises a gate insulation area between the strips 22 and the gate electrode in said gate area, aligned with the gate area (in this context, "aligned" means corresponding to the result of etching the gate area and the further strip using the same etch mask). The device comprises a source contact and a drain contact on the first parts of the strips on the respective sides of the gate area along said first direction.

If a further strip is present under the overreach, it has edges aligned with the gate area (corresponding to the result of etching the gate area and the further strip using the same etch mask), and the further strip is isolated from the strips that form the channel. If an outermost strip of the channel has a protrusion that extends into an overreach, the protrusion does not reach so far in the x-direction that it reaches the lateral edge of the gate. In the example of FIG. 8, a silicon nitride layer 80 is used to isolate the gate. Furthermore, the remaining part of the multi-level resist layer has been removed, e.g. by etching, before deposition of this silicon nitride layer 80.

It should be appreciated that the gate and the location of the channel of this device in the y direction are wholly defined by multi-level resist layer 34, i.e. that no alignment with another resist layer is needed for the definition of this location. The boundary between the first area where strips 22 of semi-conductor material are exposed and the second area where the gate is formed is defined by the location of second part 38 of multi-level resist layer 34. The conductivity increasing treatment is applied to the exposed part of strips 22 and hence the boundary of the treated part of strips 22 is aligned with the gate. The ends of this treated part effectively define the boundaries of the channel in the y-direction, which are therefore also aligned with the gate.

This is different in the x-direction. Going in the x-direction the boundaries of the channel are defined by a separation between successive parallel strips 22. The locations of these separations are defined by a patterning step that is separate from patterning of multi-level resist layer 34 and hence not self-aligned with it.

Of course it would be a simple matter to provide for self-alignment: if a continuous semi-conductor layer would be used instead of strips 22, any height level pattern like that shown in FIG. 5, where the height of the multi-level resist drops to zero where it drops going in the x-direction, would result in self alignment. However, it has been found that such a self-alignment can lead to source-drain leakage along the edge of the channel. This is prevented by avoiding self alignment in the x-direction, in combination with the use of strips 22 of semi-conductor material and an overreach d1, d2 that is larger than the pitch p of the strips. The overreach ensures that the strip etching step (fourth step 14) cuts off the strip 22 or strips 22, to the extent that they lie under the overreach. This ensures that the outermost strips 22 that extend along the edges of the source or drain area (the "first area" underneath the first part 36 of the multi-level resist layer 34) cannot extend so far laterally in the x-direction that they also underlie the edges of the gate electrode at the end of the overreach, whatever the alignment of the strips 22 and the multi-level resist layer 34. As a result leakage channels are prevented.

The conductivity increasing treatment does not reach the strips, if any, that lie underneath the edges of the side edges of the overreach of the gate electrode. Even though the source/drain metal is not self-aligned with the gate, it cannot contact a strip 22 that lies underneath a side edge of the overreach of the gate electrode, because such strips have been cut off by fourth step 14 aligned by the multi-level resist layer 34.

In an embodiment, the actual creation of source and drain contacts in sixth step 16 may be preceded by etching of the remainder of multi-level resist layer 34. The creation of source and drain contacts itself may comprise a sub-step of deposition of a silicon nitride layer, e.g. by means of a PCVD process, at least over the exposed part of strips 22. This may be followed by position selective etching to re-expose the silicon nitride layer over part of the previously exposed part of strips 22 and deposition of source/drain contact metal that contacts strips 22 where they have been re-exposed. As is known per se, deposition of silicon nitride over an indium-gallium oxide semi-conductor results in a conductivity increasing treatment. However, in other embodiments other types of conductivity increasing treatment may be used, such as WO2015010825. If needed, a distinct isolation layer may be deposited over the gate electrode and patterned before the source/drain metal is deposited.

After the steps shown in FIG. 1 further steps may be performed to finish the device. For example, one or more protection layers may be deposited.

The invention claimed is:

1. A method of manufacturing a semi-conductor device comprising a thin film transistor, the method comprising:
   providing a substrate with mutually insulated elongated strips of semi-conductor material on the substrate, the strips extending in a first direction;
   depositing an stack of layers over the strips on the substrate, the stack comprising a gate electrode layer and a gate insulation layer between the gate electrode layer and the strips;
   providing a multi-level resist layer comprising first and second parts with a first and second non-zero resist height level on top of the stack respectively, the first resist height level being smaller than the second resist height level, the second part comprising a portion that crosses the first part in a second direction transverse to the first direction, overreaching the first part on either side at least by a distance corresponding to a pitch of the strip;

etching the stack and the strips over an area of the substrate not covered by the first and second parts, using the multi-level resist layer as a mask;

etching the multi-level resist layer at least down from the first resist height level, leaving the substrate underneath the second part covered by resist from the multi-level resist layer;

etching the stack to expose parts of the strips where the first part of the multi-level resist layer has been removed, leaving a part of the gate electrode layer underneath the second part of the multi-level resist layer for use as a gate electrode of the transistor;

forming source and drain contacts of the transistor from the exposed parts of the strips.

2. A method according to claim 1, wherein the multi-level resist layer is provided by depositing resist over the stack of layers and imprinting the resist using a stamp that defines a height level pattern comprising said first and second resist height level.

3. A method according to claim 1, wherein the multi-level resist layer is provided by depositing resist over the stack of layers and illuminating the resist using with a grey level illumination pattern, wherein first and second intensity levels correspond with said first and second resist height level.

4. A method according to claim 1 comprising applying a conductivity increasing treatment to the strips after said etching of the multi-level resist layer at least down from the first resist height level.

5. A method according to claim 4, wherein the conductivity increasing treatment comprises depositing silicon nitride on the strips.

6. A method according to claim 1 comprising depositing metal on parts of the strips that are not covered by the stack after said etching of the multi-level resist layer at least down from the first resist height level, the metal forming source and drain contacts.

7. A method according to claim 1 wherein said portion that crosses the first part crosses over at least two of said strips, forming a source contact metal area that contacts all of said at least two of said strips and forming a drain contact metal area that contacts all of said at least two of said strips.

* * * * *